United States Patent
Chen et al.

(10) Patent No.: US 6,214,642 B1
(45) Date of Patent: Apr. 10, 2001

(54) AREA ARRAY STUD BUMP FLIP CHIP DEVICE AND ASSEMBLY PROCESS

(75) Inventors: William T. Chen; Syamal Kumar Lahiri, both of Singapore (SG)

(73) Assignee: Institute of Materials Research and Engineering, Singapore (SG)

(*) Notice: Subject to any disclaimer, the term of this patent is extended or adjusted under 35 U.S.C. 154(b) by 0 days.

(21) Appl. No.: 09/185,561

(22) Filed: Nov. 4, 1998

(30) Foreign Application Priority Data

Nov. 21, 1997 (SG) .................................................. 9704115

(51) Int. Cl.[7] .................................................. H01L 21/50
(52) U.S. Cl. ........................ 438/108; 438/15; 438/25; 438/106; 438/107; 438/612; 438/613; 438/127; 257/780; 257/781; 257/782; 257/783
(58) Field of Search .................................. 257/782, 783, 257/786, 781; 438/106–108, 15, 25, 612–613, 127

(56) References Cited

U.S. PATENT DOCUMENTS

| | | | |
|---|---|---|---|
| 5,436,503 | * | 7/1995 | Kunitomo et al. .................... 257/737 |
| 5,521,435 | * | 5/1996 | Mizukoshi . |
| 5,598,036 | * | 1/1997 | Ho . |
| 5,641,996 | * | 6/1997 | Omoya et al. . |
| 5,666,008 | * | 9/1997 | Tomita et al. . |
| 5,705,858 | * | 1/1998 | Tsukatamoto . |
| 5,708,304 | * | 1/1998 | Tomita . |
| 5,834,848 | * | 11/1998 | Iwasaki ................................. 257/778 |
| 5,912,507 | * | 6/1999 | Dunn et al. . |

* cited by examiner

Primary Examiner—Matthew Smith
Assistant Examiner—Granville Lee
(74) Attorney, Agent, or Firm—Lawrence Y. D. Ho; David D. Chung

(57) ABSTRACT

An area array flip chip device produced using wire bonding technology. The design and process for producing such a flip chip involves stud bumps which are bonded on the substrate, to give good electrical interconnections between the chip pads and the substrate pads. This completely eliminates the limitation of not being able to have stud bump interconnections over the active area of the chip, and allows the stud bump interconnection method to be applied over the entire chip area. The design and process can also be applied to the joining of a substrate or first level packaging to the board. In this embodiment, the stud bump process acts as a replacement for the BGA process.

13 Claims, 3 Drawing Sheets

AREA ARRAY STUD BUMP FLIP CHIP DEVICE AND ASSEMBLY PROCESS

FIELD OF THE INVENTION

The present invention is related to flip chip technology. In particular, the present invention is related to the interconnection between an integrated circuit chip and its corresponding substrate in flip chip device production. This invention is also related to the interconnection between an integrated circuit device and second level substrate such as a printed circuit board or card.

BACKGROUND OF THE INVENTION

An IC device is produced by electrically interconnecting an IC chip to an electronic substrate (hereinafter called substrate) to form one device. An electronic substrate is a non-conducting material containing single or multilayer electrically conducting traces for electrical connection. Flip chip device is produced by mounting an integrated circuit (IC) chip onto a substrate in a manner such that the active area of the IC chip and the substrate faces each other, and are electrically interconnected. Compared to other conventional methods of mounting, such as face-up wire bonding and face-up tape-automated bonding, flip chip technology provides the shortest possible leads, lowest inductance and highest frequency and density. *Flip Chip Technologies* edited by John H. Lau (1996) (Reference 1) gives an overview of the state of the art in this technology. In flip chip technology, the interconnection used to electrically connect the IC chip to the substrate include wire bumping, and solder bumping. Solder bumping can be performed on the IC chip surface and are thus useful for area array designs while wire bumping is commonly used for interconnection at the periphery of the IC chip.

Wire bonding involves the use of a wire bonder which has a wire fed through a tool called a capillary. The end of the wire is heated to a molten state where the surface tension of the liquid metal forms the shape of a ball. The capillary descends on the bond pad of the chip with a force to form a weld between the wire and the chip bond pad. Often, ultrasonic energy is included in the bonding process, in which case the process in known as thermosonic bonding. Typically the wirebond pads are situated over the periphery of the IC chips. In some instances such as in a memory chip, the bond pads are designed to be situated over the mid region of the chip. In either case, the bond pads cannot be formed over the active area of the chip.

Stud bumping is a modification of the wire bonding technique. Instead of a wire connection between the bonded IC chip and the I/O pad of the substrate, the wire is cut at the bonded ball, leaving behind a stud bump. Baba, S. in the IEEE 47th Electronic Components and Technology Conference Proceedings in 1997 pp. 268–273 (reference 2) describes the latest advances that have been made in the industry to develop a process for producing flip chips using stud bumping technology. In this reference, gold bumps are formed on the I/O pads at the periphery of the IC chip by wire bonding method, and then the bumps are pressed against the corresponding substrate pads. Typically, a conductive paste or anisotropic adhesive is added to or soldering is performed on the interconnections to complete the mechanical and electrical connection between the gold bumps and the substrate. Solder material such as solder paste or solder is commonly used. Mechanical contact pressure may also be employed. The chip is then encapsulated with an encapsulant such as thermosetting adhesive. Current state-of-the-art teaching, however, is that such wire bumping or stud bumping can only be applied to the non-active area of an IC chip, such as on the periphery, as discussed on page 58 of Reference 1. The active surface of a chip is the area corresponding to the region of the chip where the electronic elements such as transistors are fabricated. The main reason why stud bumping and wire bonding cannot be formed over the active area of the IC chip is because of the high risk of damage to the chip circuitry during the wire bonding process on the chip pads. Limiting the stud bumping to the inactive area of the chip severely limits the number of I/O pads which can be connected to the chip and also limit the direct access to the active areas of the chip, resulting in performance limitation. In addition, inactive areas have to be provided on the chip for bonding to occur, resulting in a larger surface area requirement of the chip, reducing the productivity of a given wafer size.

Solder bumping involves reflowing solder bumps which have been placed between solder wettable terminals on the IC chip and the connection pads on the substrate to form solder joints. Because solder bumping can be performed over the active surface of the chip, high density area array may be achieved, allowing smaller chip design and the manufacturing of packaging with very small footprints. Due to the advantages of area array chip designs, a great need is felt in the industry to search for more ways to produce flip chip packages and area array flip chips with maximized active areas.

OBJECT OF THE INVENTION

It is an object of the present invention to provide an area array flip chip device produced by stud bumping technology where the stud bump interconnections are over the active areas of the flip chip.

It is another object of the present invention to provide a process for stud bumping connection to the on the active surface of an IC chip.

SUMMARY OF THE INVENTION

The present invention provides a flip chip device which is produced using wire bonding technology whereby the stud bump interconnections can be made over the active area of the flip chip. The design and process for producing such a flip chip involves stud bumps which are bonded on the substrate, to give good electrical interconnections between the chip pads and the substrate pads. This completely eliminates the prior art limitation of not being able to have stud bump interconnections over the active area of the chip, and allows the stud bump interconnection method to be applied over the entire chip area. The invention can also be applied to the joining of an IC device or first level package to a second level substrate. In this application, the stud bump process acts as a replacement for the BGA process or the solder column grid array process. In another aspect of the present invention, the flip chip device produced using the stud bump interconnection according to the present invention may be electrically interconnected to a second level substrate to provide a stud bump flip chip package.

DESCRIPTION OF THE INVENTION

The present invention is a flip chip device produced by stud-bumping method. where the stud bumps are bonded to the substrate. This completely eliminates the limitation of not being able to have interconnections over the active area of the chip, and allows the stud bump interconnection method to be applied over the entire chip area to give an area array. This unexpected outcome allows wire bonding technology to be applied to area array flip chips, comparable to the flip chip solder joint interconnection method.

Figure 1:
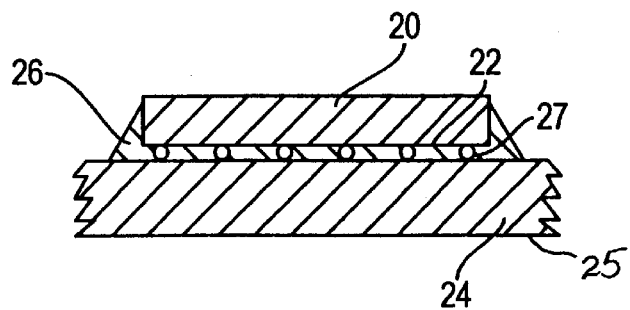
FIG. 1 is a schematic diagram showing a generic flip chip device.

FIG. 1 shows a diagram of a generic flip chip on a first level electronic substrate, with a semiconductor chip 20 having the active surface 22 facing downwards towards the electronic substrate 24. Surface 25 is the exterior surface of the substrate which may also contain exterior I/O pads for interconnection with second level substrates. These first and second level substrates may be a single or multilayer organic substrate, a ceramic substrate, a printed circuit laminate in chip on board configuration, or flexible circuit substrate, including Multi-chip Module (MCM), Chip Size Package (CSP) and Ball Grid Array (BGA) modules. These substrates have a non-conducting base containing single or multilayer electrically conducting traces for electrical connection. In between the electronic substrate and the chip is the underfilling encapsulant material 26 filling the space in between the chip and the substrate. Multiple chip-to-substrate interconnections 27 between the chip pads and the substrate pads are shown.

Figure 2A:
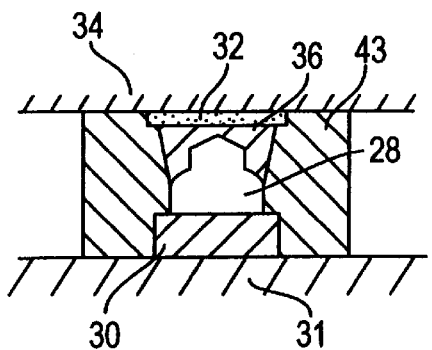
FIGS. 2A to 2D are schematic diagrams to show different types of IC chip to substrate interconnections according to the present invention.
Figure 2B:
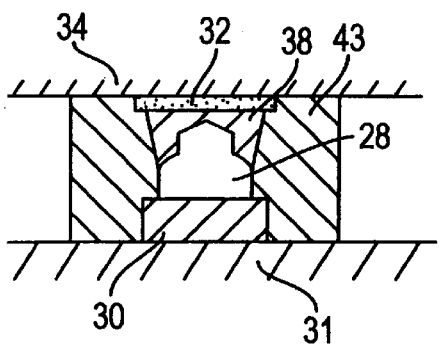
Figure 2C:
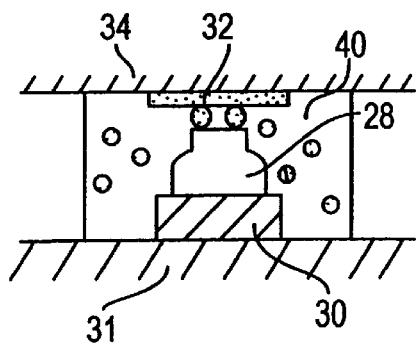
Figure 2D:
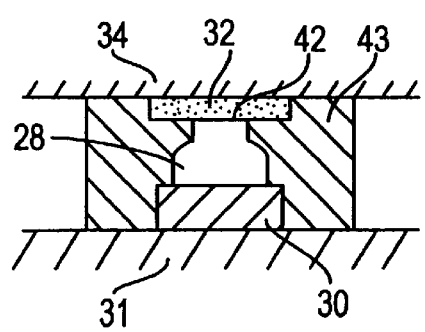

FIGS. 2A to 2D shows four embodiments of the present invention, with the stud bumps 28 on the substrate pads 30 of the substrate 31 electrically connected to the corresponding chip pad 32 of the IC chip 34. Proper contact is produced using solder 36 (FIG. 2A), electrically conductive paste 38 (FIG. 2B), isotropically or anisotropically conductive adhesive or anisotropically conductive film 40 (FIG. 2C). Mechanical contact 42 may also be used (FIG. 2D). Encapsulant 43 is typically used to seal the joints formed using solder 36, conductive paste 38 or mechanical contact 42.

Figure 3A:
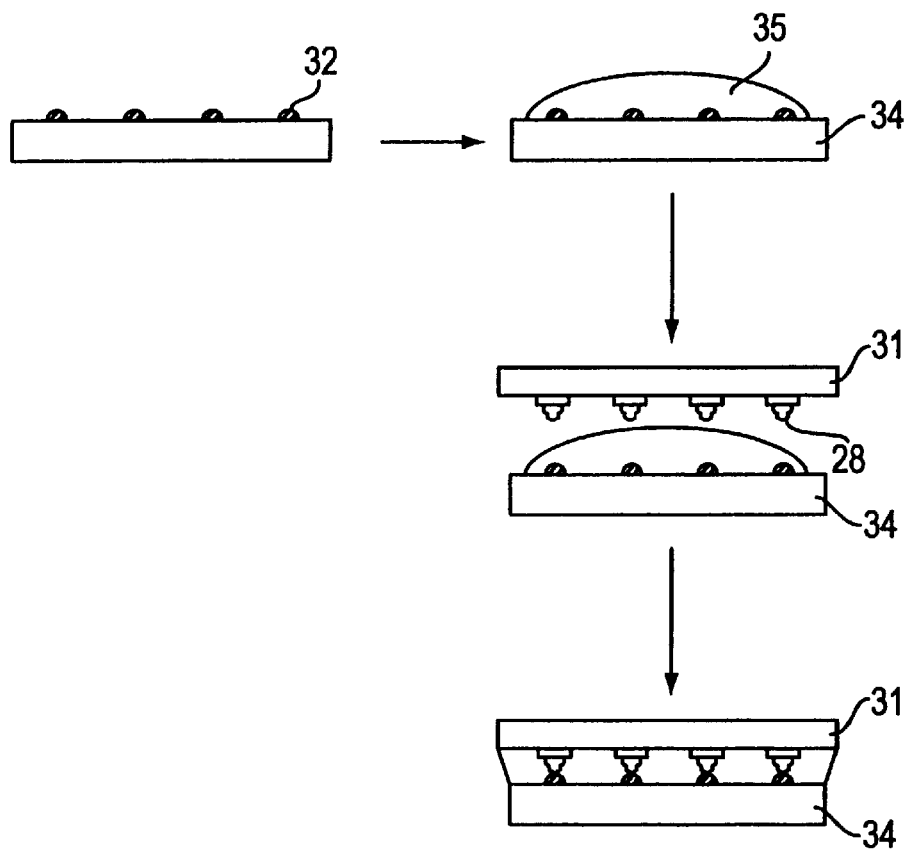
FIG. 3A is a schematic diagram showing the process of chip encapsulation using a non-flow underfill encapsulant.
Figure 3B:
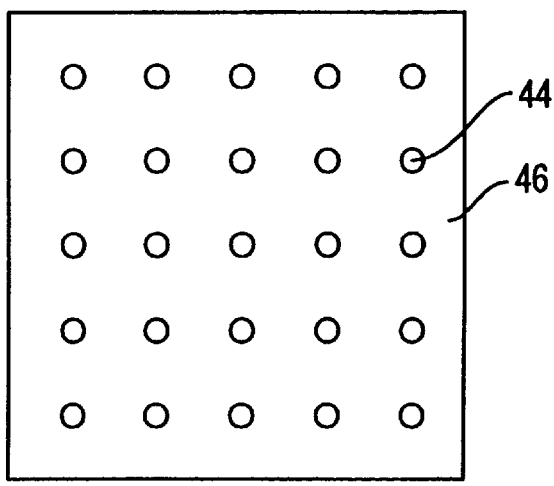
FIG. 3B is a schematic diagram showing an example of an area array of pads over the active side of the chip without limitation.

The process of producing the interconnections shown in FIG. 2A involves the use of a wire bonder to form a ball at the tip of a wire, and have the ball bonded to the substrate pad using thermosonic, ultrasonic or thermo-compression bonding techniques, which are commonly used bonding techniques used to join a wire onto a chip terminal pad. The wire is then fractured just above the ball to obtain a stud bump formed over the substrate pad. If a flat bump surface is desired, coining may be performed. Multiple bumping (one bump over another) may also be performed at this stage if significant stand-off is desirable for improved resistance to stress induced and fatigue failure. On the chip side, the I/O pads are covered with a suitable interface metallurgy consisting of a single layer or multiple layer of electrically conducting films to facilitate electrical connection. Conductive pastes are then printed or injected using a dispenser onto the chip terminal pads. Conductive paste is a general term used here to mean any paste, film or adhesives which facilitates the electrical connection between the stud bump and the chip. Examples of conductive pastes are solder paste, electrically conductive paste, isotropically conductive adhesive, anisotropically conductive adhesive and anisotropically conductive film. Alternatively, solder material may be used to facilitate the electrical connection. The chips and substrates are then appropriately aligned, assembled and joined through the application of heat as required, e.g. by solder reflow. The chip 34 and the joints could then be encapsulated with molding compounds and/or underfill materials using a liquid underfill encapsulant using capillary action as the filling process. Alternatively, a non-flow underfill encapsulant 35 as shown in FIG. 3A can be used, whereby the non-flow encapsulant is applied to the substrate or chip surface before assembly and joining are performed. Using the methods described above, a group of pads or an area array of pads 44 over the active side of a chip 46 may be obtained without limitation, as shown in FIG. 3B.

Figure 4A:
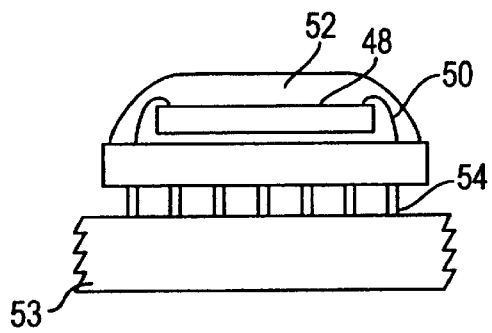
FIG. 4A shows a second level IC package of a generic wire-bonded device interconnected by stud bumping to a second level substrate according to the present invention.
Figure 4B:
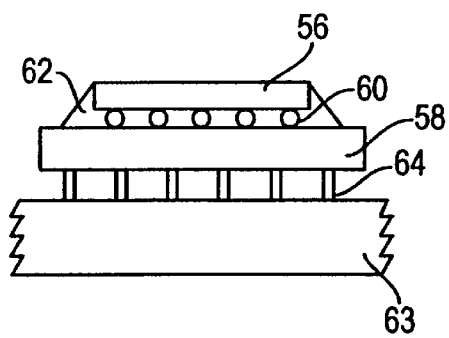
FIG. 4B shows a second level IC package of a generic flip chip device interconnected by stud bumping to a second level substrate according to the present invention.

The process described above is also applicable to joining a device or first level package to a second level substrate to give the second level package as shown in FIG. 4. In this embodiment, the stud bump process according to the present invention acts as a replacement for the BGA process in the second level packaging. FIG. 4A shows schematically a chip 48 wire-bonded with wires 50 to the carrier substrate and enclosed in encapsulant 52 in the conventional way to form an IC device. In accordance with the present invention, this device may be further interconnected to a second level substrate such as a card or board 53 via stud bump interconnections 54. FIG. 4B shows a generic flip chip with the chip 56 and substrate 58 interconnected via solder joints 60 and enclosed in encapsulant 62 in a conventional way. As in the case of the package shown in FIG. 4A, this package may also be further interconnected to a card or board 63 via stud bump interconnections 64.

Figure 5A:
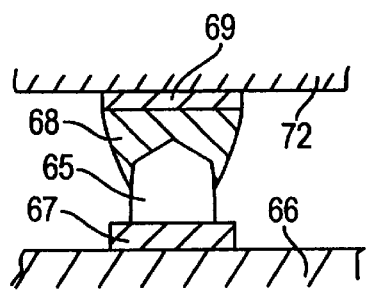
FIGS. 5A to 5D are enlarged views showing stud bump interconnections between chip carrier and card in accordance with the present invention.
Figure 5C:
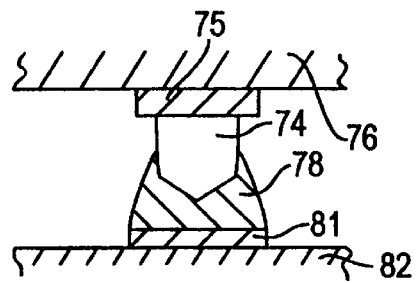
Figure 5B:
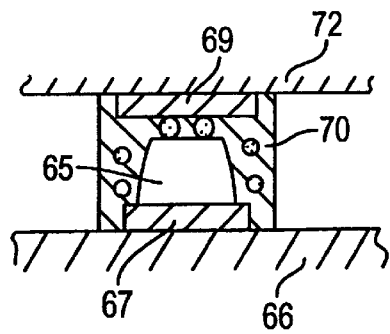
Figure 5D:
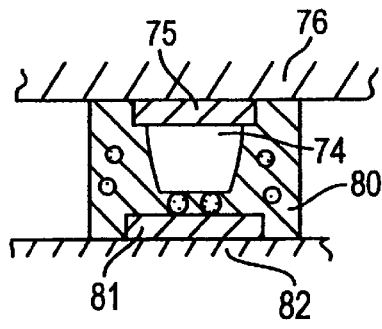

FIGS. 5A to 5D show enlarged views of four embodiments of the second level stud bump interconnections. In FIGS. 5A and 5B, the stud bumps 65 are bonded to the I/O pad 67 of the card or board 66. Solder or conductive paste 68, or anisotropic conductive adhesive or film 70 is used to complete the interconnection with the I/O pad 69 of the chip carrier or module 72. FIGS. 5C and 5D shows two embodiments wherein the stud bump 74 is bonded to the I/O pad 75 of the chip carrier 76. Solder or conductive paste 78, or anisotropic conductive adhesive or film 80 is used to complete the interconnection with the I/O pad 81 of the card or board.

While the present invention has been described particularly with references to FIGS. 1 to 5, it should be understood that the figures are for illustration only and should not be taken as limitation on the invention. The flip chip device provided in the present invention may be mounted on a second level substrate using methods such as ball grid array. This results in an IC package having a flip chip with stud bump interconnections over the active surface of the chip. As with other conventional substrates, the second level substrate may be made from ceramic, organic or combination material having single or multilayer electrically conducting traces.

In another embodiment, the flip chip device according to the present invention may have solder balls attached to the exterior I/O pads on the exterior surface of the first level substrate. This allows convenient soldering onto a second level substrate for processing into an IC package.

The stud bumps may be made from any electrically conducting wires, such as gold, solder, copper, nickel, indium, aluminum or alloy. The substrate I/O pads may comprise of electrically conducting materials such as gold, nickel, copper, molybdenum, tungsten, chromium, aluminum, zinc, titanium or any combination of such materials.

On the chip side, the I/O pads are to be covered with a suitable interface metallurgy consisting of a single layer or multiple layer of films comprising of materials such as gold, chromium, copper, aluminum, solder, nickel, titanium, zinc or any combination of such materials. Printing or injection using a dispenser may be performed to introduce the conductive paste or adhesives or solder paste onto the chip terminal pads. Alternatively, these pastes or adhesives may be deposited onto the corresponding substrate pads. In this case, the chip I/O pads are covered with an interface and protective metallurgy to protect the IC chip bond pad metallization from contamination or corrosion. In other variations, anisotropically conductive films or adhesives may be used to join the studded substrate I/O pads to the matching chip I/O pads that are covered with appropriate interface metallurgy. Also, the surfaces could be joined mechanically after suitably preparing the surfaces to establish electrical contacts 42 (FIG. 2D). The process is applicable to chips with aluminum terminal pads, as well as copper or any other terminal pads. As an alternative, solder material may also be used on the I/O pads to facilitate the electrical interconnection.

The first level substrate according to the present invention includes chip carrier or any other platform where the chips are attached to. The process is also applicable to direct chip joining to flexible substrate or board, with the board made from materials such as inorganic (e.g. ceramic), organic or glass epoxy. These same material can be used for the second level substrate. The stud bonding may be strengthened further by modifications of the surface to be joined by plasma treatment. The interconnections envisioned in the present invention may also be used for interconnecting chip to substrate/carrier, as well as chip to board. Besides the variations described above, it is contemplated that many changes and modifications may be made by one of ordinary skill in the art without departing from the spirit and the scope of the invention described.

The present invention retains all the advantages of the stud bump design and process for flip chip and BGA/CSP interconnections in terms of size, weight and low cost while avoiding the serious limitation of not able to join to the active surface of the chip. In addition, existing wire bonding tools and materials may be utilized. With the wire-bonding pad pitch progressing to 50 microns, the present invention will allow chips and modules to achieve thousands of I/O interconnections, comparable to conventional solder joint flip chip and BGA interconnections using existing wire-bonding tools and materials.

What is claimed is:

1. A method for producing a flip chip device, said flip chip device containing a chip having an active surface with a central active area and a peripheral area, the central active area having at least one I/O pad thereon, a substrate having opposing first and second surfaces, said first surface having at least one substrate I/O pad corresponding to said chip I/O pad, said chip I/O pad and said substrate I/O pad electrically interconnected by a stud bump interconnection, said second surface having at least one exterior I/O pad electrically connected to the corresponding substrate I/O pad; said method comprising the steps of:

forming the stud bump on the I/O pad on the first surface of said substrate, said forming comprising the steps of:
  forming a ball at a tip of bonding wire;
  bonding said ball to the I/O pad on said first surface of the substrate by a wire bonding method; and
  fracturing the wire at a point proximate the bonded ball to form the stud bump on the I/O pad on said first surface of said substrate, said stud bump adapted for interconnection with said I/O pad on said chip;
applying at least one layer of interface metallurgy on the I/O pad of the chip;
aligning the chip I/O pad with the stud bump on the I/O pad on said first surface of said substrate; and
after the step of forming the stud bump, assembling the device by joining the I/O pad on said chip to the stud bump on the I/O pad on said first surface of said substrate to form an electrical interconnection between the I/O pad on said chip and the I/O pad on said first surface of said substrate.

2. A method for producing a flip chip device according to claim 1 wherein an additional step of pin or solder ball placement and attachment is provided whereby pins or solder balls are attached to the at least one exterior I/O pad.

3. A method for producing a flip chip device according to claim 1 wherein an additional step of applying conductive material onto the stud bump or the substrate I/O pad is performed before the joining step.

4. A method for producing a flip chip device according to claim 3 wherein said conductive material is a solder material, electrically conductive paste, isotropically conductive adhesive, anisotropically conductive adhesive, or anisotropically conductive film.

5. A method for producing a flip chip device according to claim 1 wherein an additional step of injecting an encapsulant between the substrate and the chip is performed after the joining step.

6. A method for producing a flip chip device according to claim 1 wherein an additional step of applying an encapsulant between the substrate and the chip is performed prior to the assembly and joining step, where said encapsulant is a non-flow underfill encapsulant or a liquid encapsulant.

7. A method for producing a flip chip device according to claim 1 wherein coining of the stud bump is performed to smoothen the surface of the fracture point after said fracturing step.

8. A method for producing an IC package, said package having an IC device with at least one exterior I/O pad provided on the exterior surface of the device, and having a second level substrate with at least one I/O pad thereon, said method comprising the steps of:

forming stud bumps on said at least one I/O pad on said second level substrate, said forming comprising the steps of:
  forming a ball at a tip of bonding wire;
  bonding said ball to the at least one I/O pad on the second level substrate;
fracturing the wire at a point proximate the bonded ball to form a stud bump on the at least one I/O pad on the second level substrate, said stud bump adapted for interconnection with the I/O pad on the exterior surface of the device;
applying an electrically conductive material onto the exterior I/O pad or the stud bump;
aligning the bonded stud bump with the I/O pad on the exterior surface of the device; and joining the I/O pad on the exterior surface of the IC device to the stud bump on the second level substrate via the conductive material to form an electrical interconnection.

9. A method for producing an IC package according to claim 8 wherein said electrically conductive material is a solder material, electrically conductive paste, isotropically conductive adhesive, anisatropically conductive adhesive, or anisotropically conductive film.

10. A method for producing an IC package according to claim 8 wherein said second level substrate is a polymer substrate, flexible substrate a plastic substrate, a ceramic substrate or a combination thereof.

11. A method for producing an IC package according to claim 8 wherein coining of the stud bump is performed to smoothen the surface of the fracture point after said fracturing step.

12. A method for producing an IC package according to claim 8 wherein an additional step of injecting an encapsulant between the second level substrate and the IC device is performed after the joining step.

13. A method for producing an IC package according to claim 8 wherein an additional step of applying an encapsulant between the substrate and the chip is performed prior to the joining step, wherein said encapsulant is a non-flow underfill encapsulant or a liquid encapsulant.

* * * * *